US007340830B2

(12) United States Patent
Liu et al.

(10) Patent No.: US 7,340,830 B2
(45) Date of Patent: Mar. 11, 2008

(54) METHOD OF MANUFACTURING LED LIGHT STRING

(76) Inventors: Li-Wen Liu, 3F-1, No. 193-2, Nanya St., Hsinchu (TW); Wei-Jen Liu, 3F-1, No. 193-2, Nanya St., Hsinchu (TW)

( * ) Notice: Subject to any disclaimer, the term of this patent is extended or adjusted under 35 U.S.C. 154(b) by 1086 days.

(21) Appl. No.: 10/694,015

(22) Filed: Oct. 28, 2003

(65) Prior Publication Data

US 2005/0086801 A1 Apr. 28, 2005

(51) Int. Cl.
*H05K 13/00* (2006.01)
*H05K 3/36* (2006.01)
*H01R 43/00* (2006.01)

(52) U.S. Cl. ............................ 29/854; 29/857; 29/830; 29/876; 29/829; 362/555; 362/240; 362/249

(58) Field of Classification Search .................. 29/854, 29/829, 830, 876; 362/555, 249
See application file for complete search history.

(56) References Cited

U.S. PATENT DOCUMENTS

| | | | | |
|---|---|---|---|---|
| 6,283,612 | B1 * | 9/2001 | Hunter | 362/240 |
| 6,371,637 | B1 * | 4/2002 | Atchinson et al. | 362/555 |
| 6,566,824 | B2 * | 5/2003 | Panagotacos et al. | 315/291 |
| 6,648,498 | B1 * | 11/2003 | Tsao | 362/235 |
| 7,135,034 | B2 * | 11/2006 | Friedman et al. | 607/88 |
| 2003/0224687 | A1 * | 12/2003 | Fu et al. | 445/22 |
| 2004/0260470 | A1 * | 12/2004 | Rast | 701/300 |
| 2005/0044703 | A1 * | 3/2005 | Liu et al. | 29/876 |
| 2005/0162850 | A1 * | 7/2005 | Luk et al. | 362/227 |
| 2005/0180162 | A1 * | 8/2005 | Fan | 362/555 |
| 2005/0286260 | A1 * | 12/2005 | Liu et al. | 362/551 |

FOREIGN PATENT DOCUMENTS

EP 1357331 A2 * 10/2003

* cited by examiner

*Primary Examiner*—Terrence R. Till
*Assistant Examiner*—Jossef Zilberman
(74) *Attorney, Agent, or Firm*—Rabin & Berdo, P.C.

(57) ABSTRACT

A method of manufacturing LED light string includes the steps of forming an LED light body from multiple serially connected printed circuit boards, fixing the LED light body to a base, and connecting a light-transmissible shell to the light body to form a cluster lamp; preparing a power cord, to which multiple lamp sockets are serially connected; fitting multiple cluster lamps to the lamp sockets on the power cord, so that the LED light bodies are made to emit light. A lampshade is detachably engaged with each lamp socket. The lampshade and the lamp socket may be differently designed to create romantic feeling. The number of LED light bodies on each cluster lamp and the number of cluster lamps on one LED light string may be varied as desired to increase the brightness of the light string while reduce the manufacturing cost of the LED light string.

6 Claims, 6 Drawing Sheets

METHOD OF MANUFACTURING LED LIGHT STRING

FIELD OF THE INVENTION

The present invention relates to a method of manufacturing an LED light string, and more particularly to a method of manufacturing an LED light string that has romantic feeling, esthetic appearance, and increased brightness, and may be manufactured at reduced cost.

BACKGROUND OF THE INVENTION

Light strings are widely employed in decorating different places, such as being wound around Christmas trees, hung along stages, etc., in order to create warm and cheerful atmosphere.

A conventional light string uses bulbs as light sources to emit light. The bulbs are screwed to a plurality of serially connected bulb sockets provided on a power cord to complete a whole light string.

The bulbs are separately screwed to the bulb sockets that are serially connected via the power cord, and are therefore normal to the power cord. However, the power cord is soft and might become twisted to cause the bulb sockets and the bulbs on the power cord to point toward different directions instead of being located at the same one vertical plane. That is, the bulbs on the power cord of the conventional light string tend to turn leftward or rightward. When the conventional light string is extended along outer edges of the stage or stairs to decorate the same, the irregularly turned bulb sockets and bulbs on the twisted power cord of the light string are easily collided with one another or treaded on to become damaged. The irregularly turned bulbs also decrease the beautiful appearance of the light string. Moreover, the bulbs consume a large quantity of power and produce a high amount of heat. A damaged or broken bulb would also dangerously cause short circuit to produce safety problem in use.

It is therefore tried by the inventor to develop a method for manufacturing an improved LED light string that has romantic feeling, esthetic appearance, and increased brightness, and may be manufactured at reduced cost.

SUMMARY OF THE INVENTION

A primary object of the present invention is to provide a method of manufacturing an LED light string that has romantic feeling, esthetic appearance, and increased brightness, and may be manufactured at reduced cost.

To achieve the above and other objects, the method of the present invention for manufacturing the LED light string mainly includes the following steps: forming an LED light body from multiple serially connected printed circuit boards, fixing the LED light body to a base, and connecting a light-transmissible shell to the light body to form a cluster lamp; preparing a power cord, to which multiple lamp sockets are serially connected; fitting multiple cluster lamps to the lamp sockets on the power cord, so that the LED light bodies are made to emit light; and detachably engaging a lampshade with each lamp socket.

The lampshade and the lamp socket may be differently designed to create romantic feeling. The number of LED light bodies on each cluster lamp and the number of cluster lamps on one LED light string may be varied as desired to increase the brightness of the light string while reduces the manufacturing cost of the LED light string.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 1 to 13 that sequentially shows steps 1 to 13 included in a method of manufacturing LED light string according to the present invention.

Figure 1:
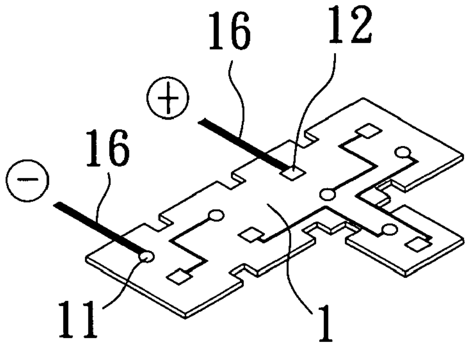
FIG. 1 shows the first step of the method of the present invention for manufacturing an LED light string.

In Step 1 as shown in FIG. 1, three or five integrally connected rectangular printed circuit boards 1 are prepared. These printed circuit boards 1 are so arranged that they may be folded toward one another in a predetermined manner. Each of the printed circuit boards 1 is provided with a positive and a negative electrode 12, 11 that are in square and round shapes, respectively, to enable easy distinction of these electrodes from one another during manufacturing process. Two connecting legs 16 are separately connected to one predetermined positive and one predetermined negative electrode 12, 11 for connecting to a base 2 later (see Step 5).

Figure 2:
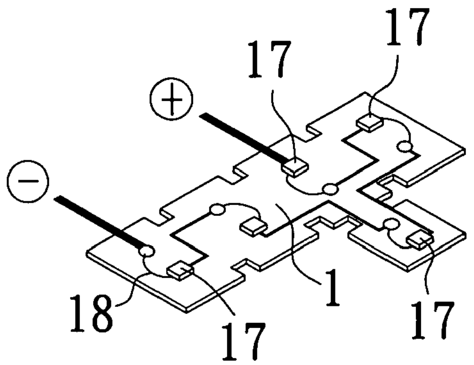
FIG. 2 shows the second step of the method of the present invention.

In Step 2 as shown in FIG. 2, an LED chip 17 is mounted on each of the printed circuit boards 1, and a metal conducting wire 18 is connected at an end to the LED chip 17 and at the other end to another printed circuit board 1. The LED chips 17 are not necessarily to provide the same light color, but may provide different light colors.

Figure 3:
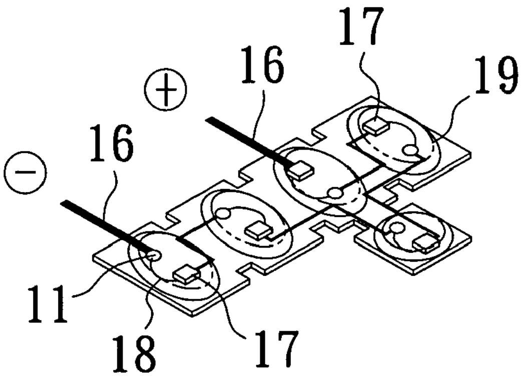
FIG. 3 shows the third step of the method of the present invention.

In Step 3 as shown in FIG. 3, epoxy resin 19 is applied to encapsulate the LED chips 17 on the printed circuit boards 1. Allow the epoxy resin 19 to dry and set and form a transparent capsule on each of the printed circuit boards 1.

Figure 4:
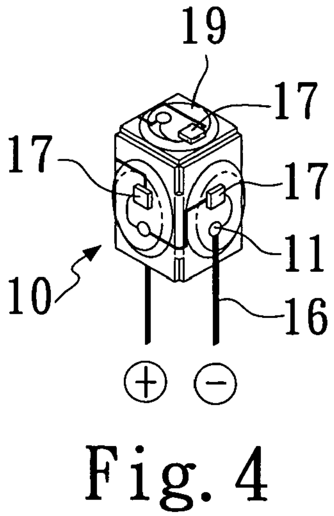
FIG. 4 shows the fourth step of the method of the present invention.

In Step 4 as shown in FIG. 4, the printed circuit boards 1 are folded to form a light body 10 having a top and four sides, all of which are adapted to outward emit light.

Figure 5:
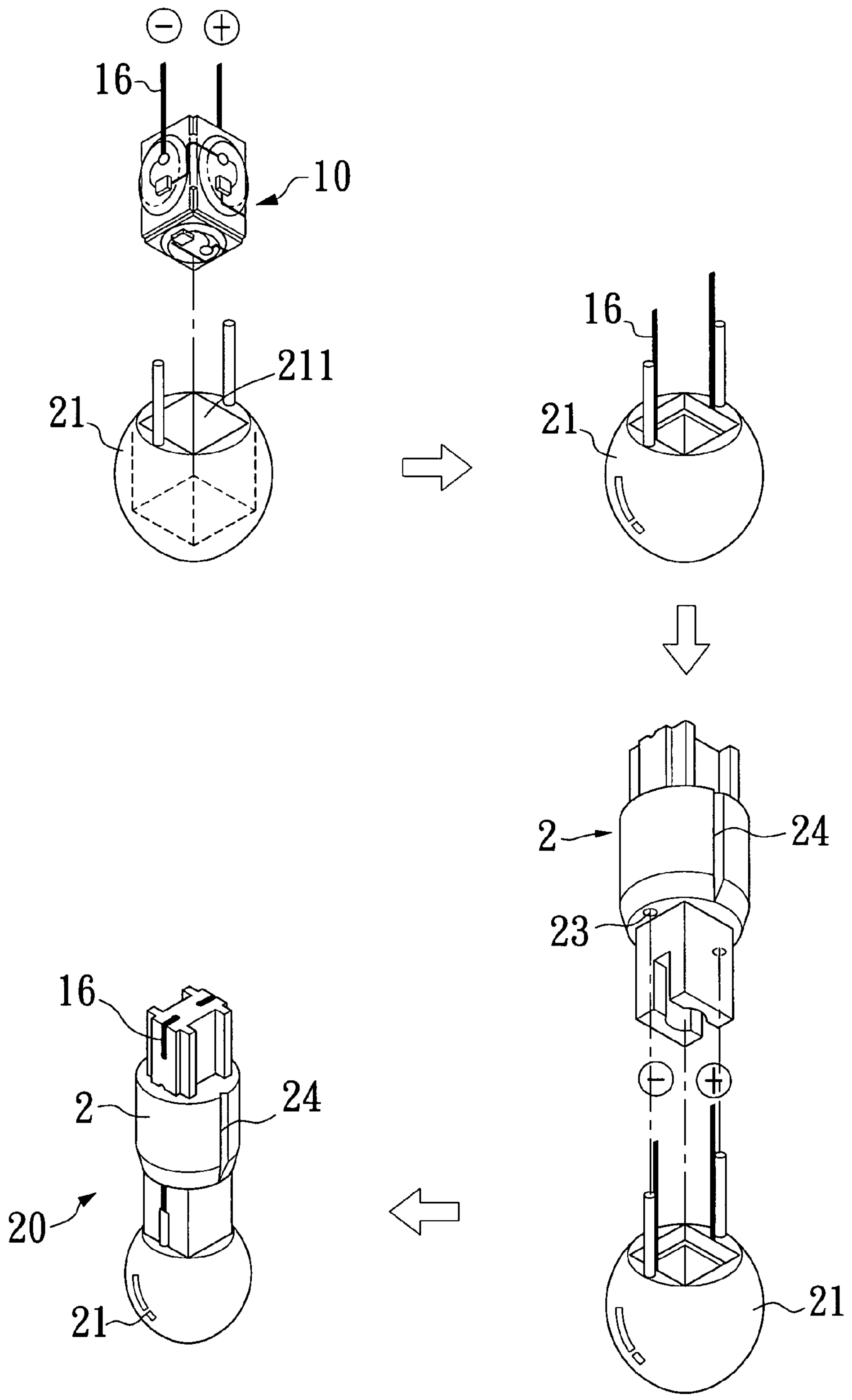
FIG. 5 shows the fifth step of the method of the present invention.

In Step 5 as shown in FIG. 5, the light body 10 is disposed from the top into a light-transmissible shell 21 to expose the connecting legs 16 from the shell 21, and then a base 2 is connected to the shell 21 with the two connecting legs 16 extended through two through holes 23 provided on the base 2. The connecting legs 16 extended through the two through holes 23 and projected from a bottom of the base 2 are bent outward to fitly bear against rear outer surfaces of the base 2. The base 2 is provided at one side with an axial error protection groove 24 for easy identifying of the polarity of the two connecting legs 16. After the light body 10 is disposed in the light-transmissible shell 21 and connected to the base 2, a cluster lamp 20 is formed. The light-transmissible shell 21 is substantially round in shape defining an inner space 211 corresponding to the light body 10 for fitly receiving the light body 10 therein. With the inner space 211, the light-transmissible shell 21 is divided into five convex lenses adapted to increase the luminous intensity of light emitted from the light body 10.

Figure 6:
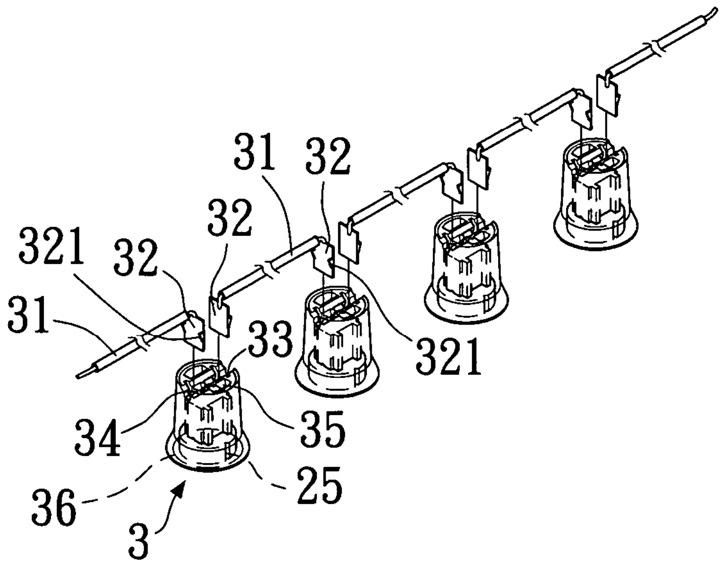
FIG. 6 shows the sixth step of the method of the present invention.

In Step 6 as shown in FIG. 6, a plurality of cup-shaped lamp sockets 3 and a plurality of conductors 31 having electrically conductive terminals 32 provided at two ends are prepared. Each of the lamp sockets 3 is adapted to fitly engage with one cluster lamp 20 completed in the Step 5. The lamp socket 3 is provided at a rear bottom with a transverse groove 33, and two insertion holes 34 located at two ends of the groove 33 adapted to receive the electrically conductive terminals 32 on the conductor 31. Each of the lamp sockets 3 is also internally provided with a rib (not shown) adapted to engage with the error protection groove 24 on the cluster lamp 20 fitted in the lamp socket 3. Each of the electrically conductive terminals 32 is provided at an inner side with a projected hook 321 that prevents the terminal 32 from moving out of the insertion hole 34 once the terminal 32 has been inserted into the hole 34. Two retaining holes 35 are separately provided at two sides of the groove 33, and an annular groove 36 is provided at an inner side of the lamp socket 3 close to a front opening thereof.

Figure 7:
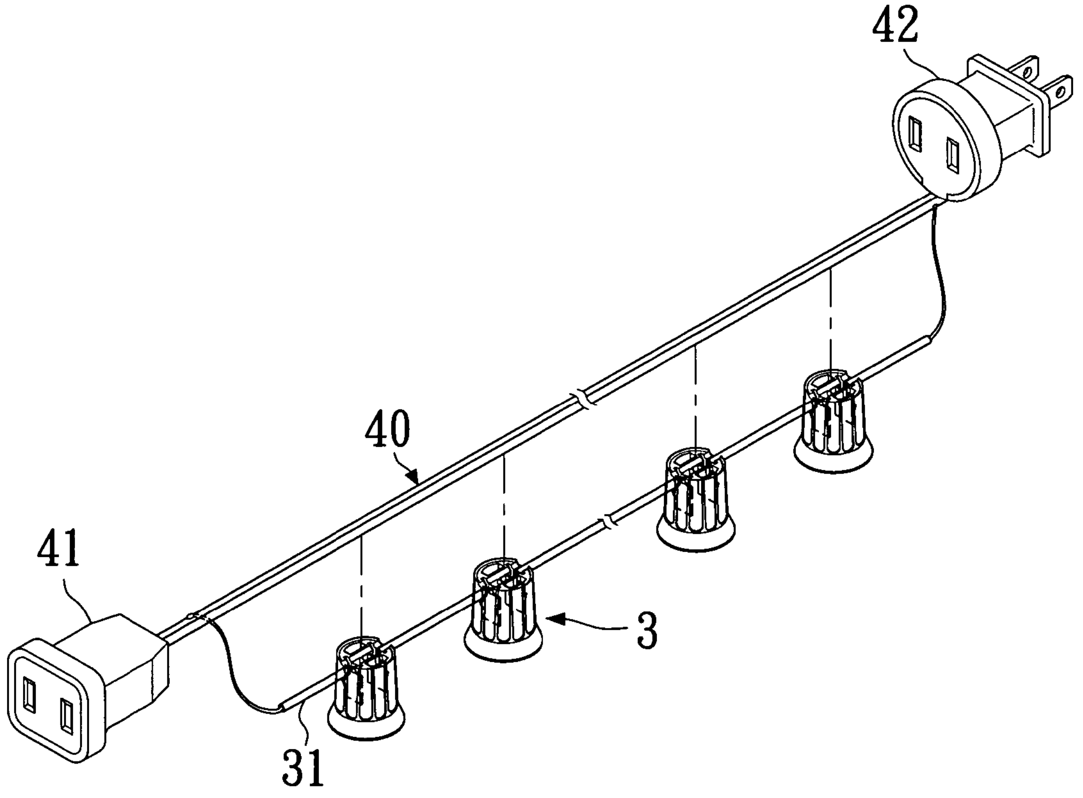
FIG. 7 shows the seventh step of the method of the present invention.

In Step 7 as shown in FIG. 7, the terminals 32 at two ends of each conductor 31 are separately inserted into two insertion holes 34 on two adjacent lamp sockets 3, so that the a plurality of lamp sockets 3 are serially connected. A power cord 40 having two ends is prepared. An end of the power cord 40 has a socket 41, to which a plug (not shown) may be plugged. The other end of the power cord 40 has a connector 42, an outer end of which is a plug and an inner end of which is a socket.

Figure 8:
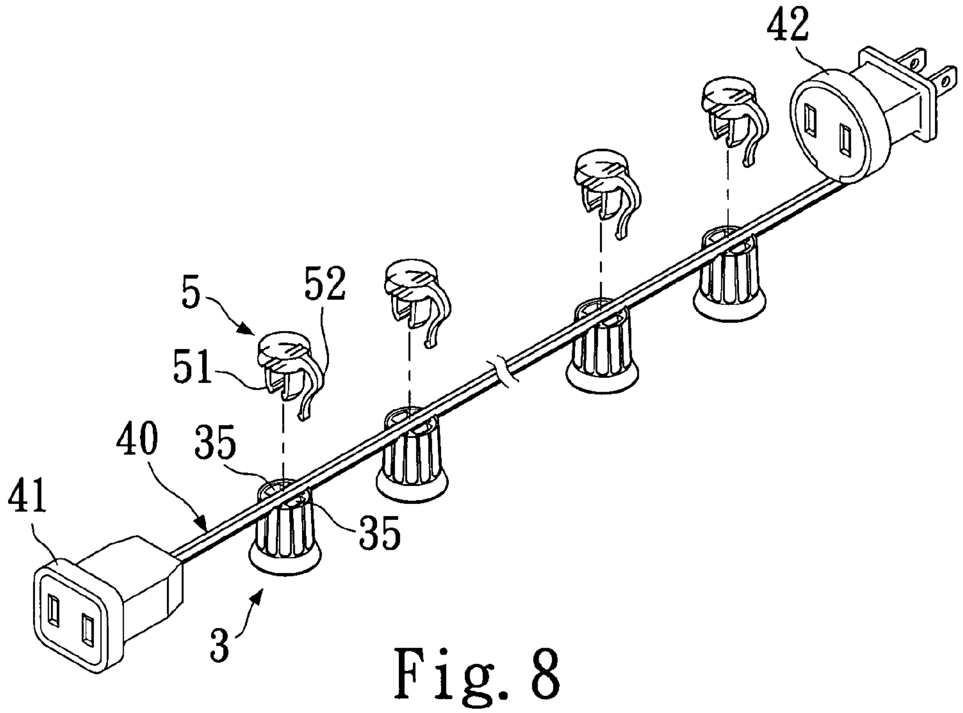
FIG. 8 shows the eighth step of the method of the present invention.

In Step 8 as shown in FIG. 8, the power cord 40 is seated in the grooves 33 of the serially connected lamp sockets 3, and the two conductors 31 of the first and the last one of the lamp sockets 3 on the power cord 40 are electrically connected at respective outer end to the power cord 40. A top cap 5 is prepared for each lamp socket 3. The top cap 5 includes two hooks 51 downward extended from a bottom thereof and an ear portion 52 downward extended from one side thereof.

Figure 9:
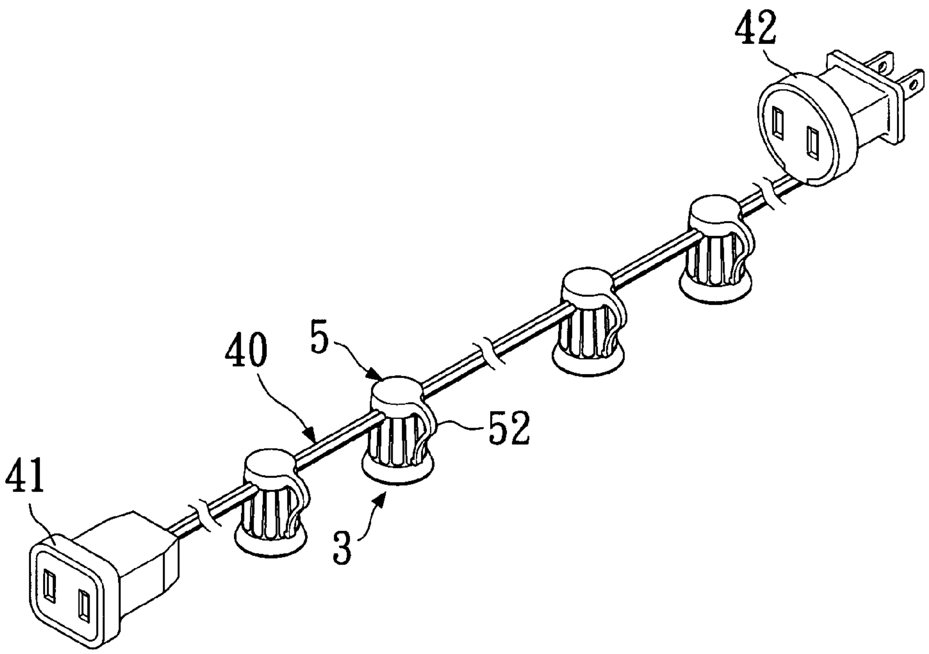
FIG. 9 shows the ninth step of the method of the present invention.

In Step 9 as shown in FIG. 9, the top caps 5 are closed onto the lamp sockets 3 one by one with the two hooks 51 of each top cap 5 inserted into the two retaining holes 35 located at two sides of the groove 33 of the lamp socket 3, so that the power cord 40, the conductors 31, and the socket lamps 3 are firmly held together. In this manner, the ear portions 52 serve as handles of the cup-shaped lamp sockets 3. It is understood the lamp socket 3 and the top cap 5 may be other mated shapes depending on actual design and need.

Figure 10:
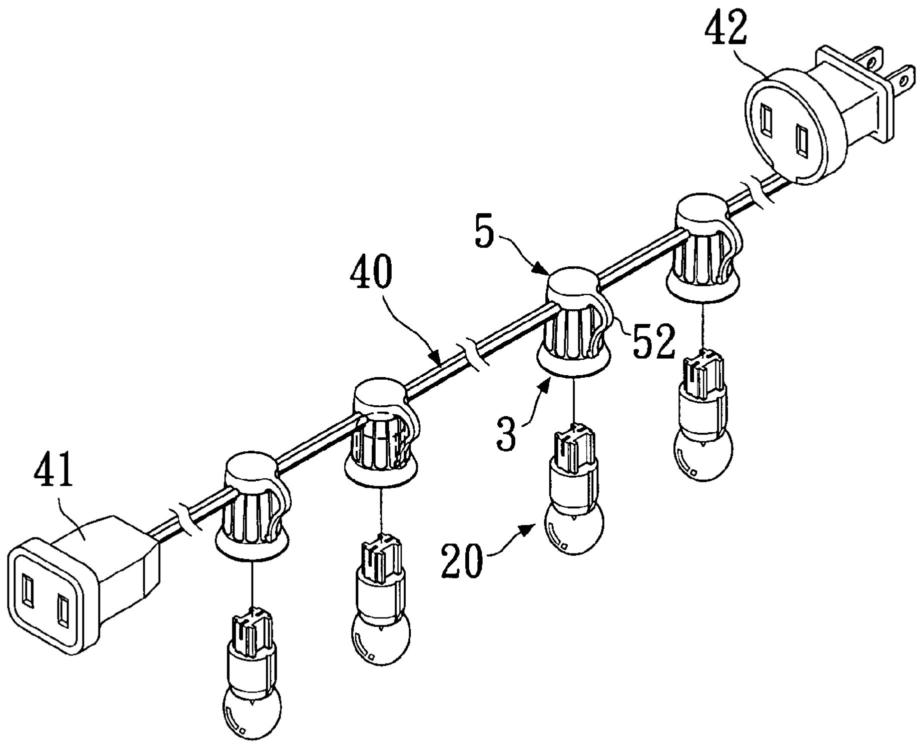
FIG. 10 shows the tenth step of the method of the present invention.

In Step 10 as shown in FIG. 10, the lamp sockets 3 associated with the power cord 40 are positioned, and cluster lamps 20 in the number corresponding to that of the lamp sockets 3 on the power cord 40 are prepared for separately connecting to the lamp sockets 3.

Figure 11:
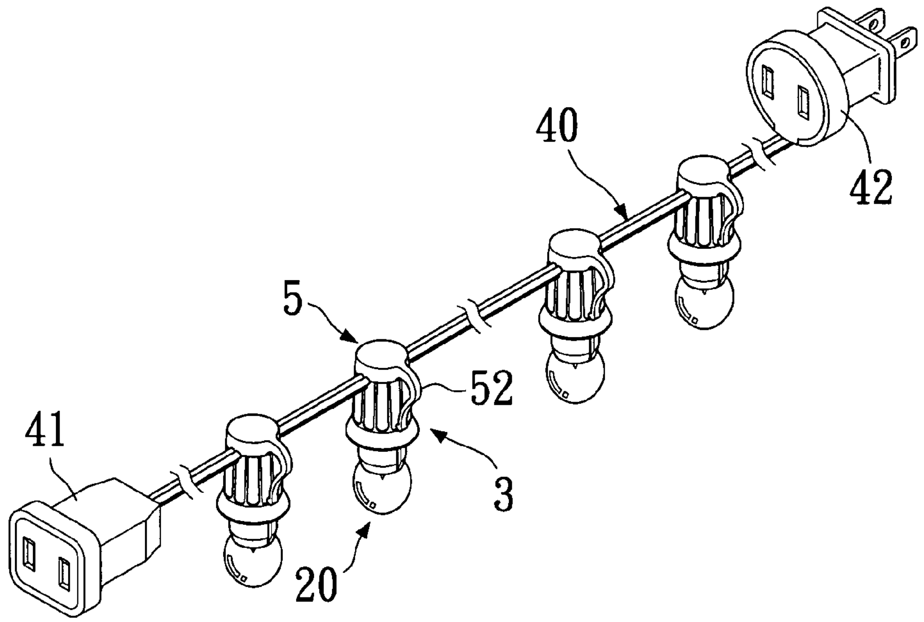
FIG. 11 shows the eleventh step of the method of the present invention.

In Step 11 as shown in FIG. 11, insert the bases 2 of the cluster lamps 20 into the lamp sockets 3 one by one, so that the two connecting legs 16 on each base 2 are in contact with the two electrically conductive terminals 32 located in the two insertion holes 34 on each lamp socket 3 to serially connect the cluster lamps 20.

Figure 12:
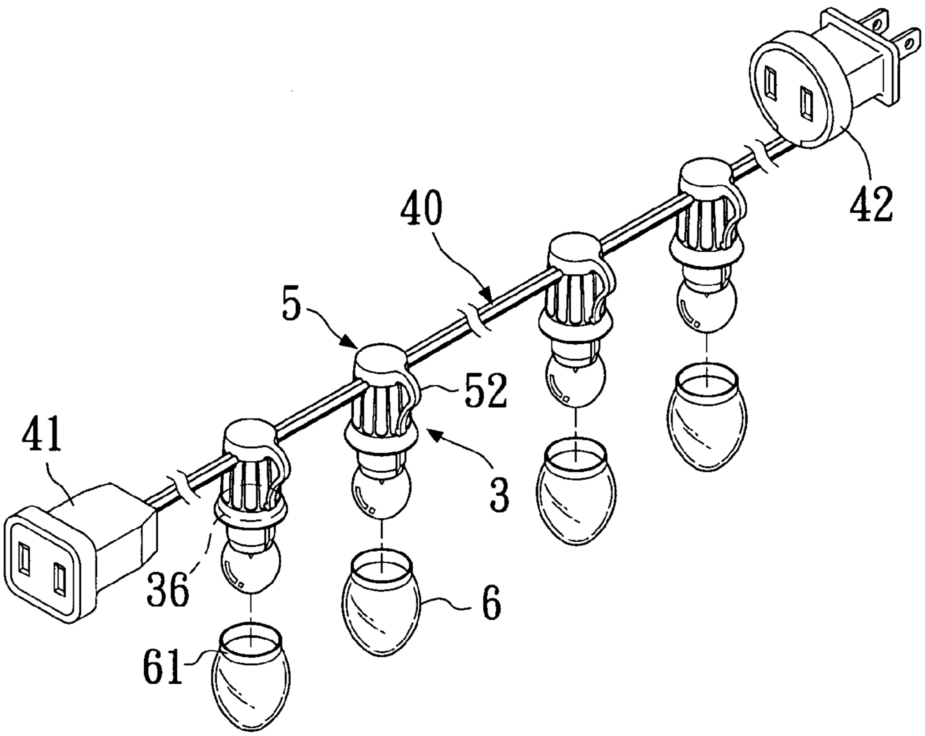
FIG. 12 shows the twelfth step of the method of the present invention.

In Step 12 as shown in FIG. 12, a plurality of lampshades 6 in the number corresponding to that of the lamp sockets 3 are prepared. Each of the lampshades 6 is provided around an opening thereof with an annular rib 61.

Figure 13:
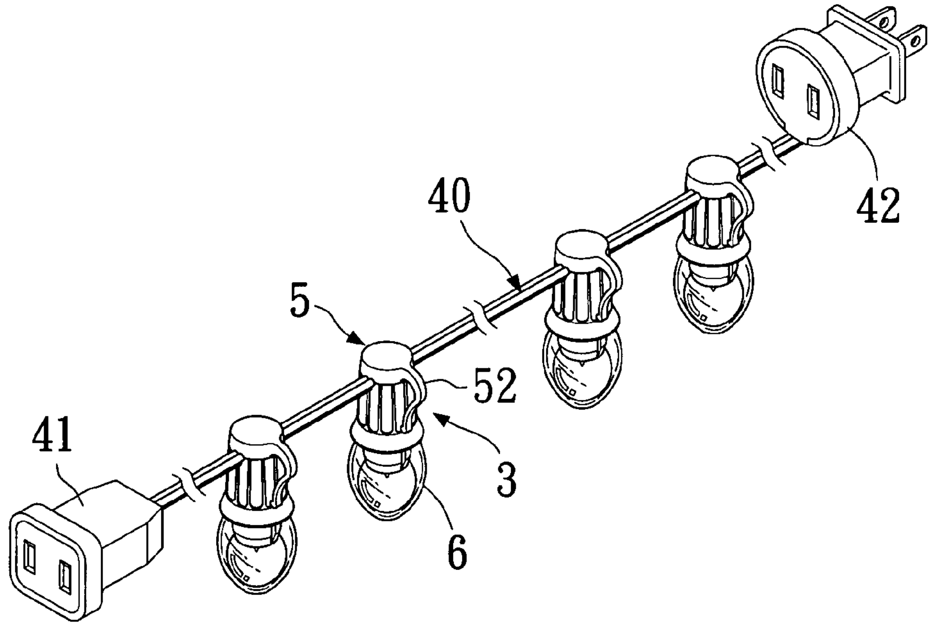
FIG. 13 shows the thirteenth step of the method of the present invention.

In Step 13 as shown in FIG. 13, the lampshades 6 are connected to the lamp sockets 3 one by one by engaging the annular rib 61 with the annular groove 36 provided at the inner side of the socket lamp 3. And, the lampshades 6 may be manufactured to show different colors.

With the above-described method, the number of LED lights on the cluster lamps and the shapes of the lampshades may be varied as desired. The LED light string can therefore be produced at reduced cost to show esthetic appearance and increased brightness.

What is claimed is:

1. A method of manufacturing LED light string, comprising the steps of:

(a) Preparing a plurality of printed circuit boards that may be folded toward one another in a predetermined manner, each of said printed circuit boards being provided with a positive and a negative electrode that are in square and round shapes, respectively, to enable easy identification thereof, and two connecting legs being separately connected to one predetermined positive and one predetermined negative electrode for connecting to a base later;

(b) Folding said printed circuit boards to form a light body, disposing said light body into a light-transmissible shell, and then connecting said light body with said shell to a base to form a cluster lamp;

(c) Preparing a plurality of lamp sockets, into each of which one said cluster lamp may be inserted; a plurality of conductors, each of which has two electrically terminals connected to two ends thereof; a power cord, an end of which is provided with a connector having a plug end and a socket end; and a plurality of top caps, each of which may be fitly closed to a rear bottom of each said lamp socket;

(d) Separately inserting said two terminals at two ends of each said conductor into two insertion holes on two adjacent lamp sockets, so that said a plurality of lamp sockets are serially connected; and (e) Connecting a lampshade to an opening of each said lamp socket.

2. The method of manufacturing LED light string as claimed in claim 1, wherein the number of said printed circuit boards prepared in the step (a) for folding into one said light body in the step (b) may be two, three, five, or more than five, and wherein said light body formed from said folded printed circuit boards in the step (b) may have a configuration selected from the group consisting of rectangle, flat plane, semi-sphere, and sphere.

3. The method of manufacturing LED light string as claimed in claim 1, wherein the step (a) further includes mounting of LED chips of different light colors on said printed circuit boards, so that each of said light body formed in the step (b) is able to emit light showing more than one color.

4. The method of manufacturing LED light string as claimed in claim 1, wherein said base in the step (b) is externally provided at one side with an error protection groove, and said lamp socket prepared in the step (c) is internally provided with a rib corresponding to and adapted to engage with said error protection groove, so as to enable easy distinction said position electrode from said negative electrode during the manufacturing of said LED light string.

5. The method of manufacturing LED light string as claimed in claim 1, wherein said light-transmissible shell used in the step (b) is substantially round in shape, and defines an inner space that is adapted to fitly receive said light body therein and divides said light-transmissible shell into a plurality of convex lenses.

6. The method of manufacturing LED light string as claimed in claim 1, wherein each of said lamp sockets prepared in the step (c) is provided along an inner side close to an opening thereof with an annular groove, and each said lampshade used in the step (e) is provided along an outer side close to an opening thereof with an annular rib for fitly and firmly engaging with said annular groove of said lamp socket, preventing said lampshade from separating from said lamp socket.

* * * * *